US011163534B2

United States Patent
Sato et al.

(10) Patent No.: US 11,163,534 B2
(45) Date of Patent: Nov. 2, 2021

(54) ARITHMETIC DEVICE

(71) Applicant: KABUSHIKI KAISHA TOSHIBA, Tokyo (JP)

(72) Inventors: Rie Sato, Kanagawa (JP); Koichi Mizushima, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 245 days.

(21) Appl. No.: 16/351,287

(22) Filed: Mar. 12, 2019

(65) Prior Publication Data
US 2020/0019377 A1 Jan. 16, 2020

(30) Foreign Application Priority Data
Jul. 10, 2018 (JP) .............................. JP2018-131057

(51) Int. Cl.
*G06F 7/575* (2006.01)
*G11C 19/28* (2006.01)

(52) U.S. Cl.
CPC ............ *G06F 7/575* (2013.01); *G11C 19/282* (2013.01)

(58) Field of Classification Search
CPC .......... G06F 7/57; G06F 7/575; G06F 7/5443; G06F 17/10; G06F 17/11; G06F 17/15; G06F 17/153; G06F 17/17; G06F 17/18; G06N 3/04; G06N 3/046; G06N 3/049; G06N 3/0445; G06N 3/0472; G06N 3/06; G06N 3/063; G06N 3/0635; G06N 3/067; G06N 3/0675; G06N 7/00; G06N 7/005; G06N 7/04; G06N 7/043; G06N 7/046; G06N 10/00; G06N 20/00
See application file for complete search history.

(56) References Cited

U.S. PATENT DOCUMENTS

| | | | | | |
|---|---|---|---|---|---|
| 4,326,192 | A | * | 4/1982 | Merrill ..................... | H03M 1/42 |
| | | | | | 341/172 |
| 5,008,833 | A | * | 4/1991 | Agranat ............... | G06N 3/0675 |
| | | | | | 706/40 |
| 5,508,538 | A | * | 4/1996 | Fijany .................... | G06N 3/063 |
| | | | | | 257/214 |

(Continued)

FOREIGN PATENT DOCUMENTS

| | | |
|---|---|---|
| JP | S57-4538 A | 1/1982 |
| JP | H4-507026 A | 12/1992 |

(Continued)

OTHER PUBLICATIONS

L. Chen at al., A Hybrid Architecture for Hopfield Neural Network and Its GaAs Implementation Using CCDs as Storage Elements, IEEE WESCANEX '95 Proceedings, 1995 (Year: 1995).*

K. Mizushima et al., Large-scale Ising-machines composed of magnetic neurons, Applied Physics Letters, III, 172406, Oct. 26, 2017 (Year: 2017).* https://www.co.sel.co.jp/technology/os_ai.html, 4 pages, and machine translation, 1 page.

(Continued)

*Primary Examiner* — Emily E Larocque
(74) *Attorney, Agent, or Firm* — Finnegan, Henderson, Farabow, Garrett & Dunner, L.L.P.

(57) ABSTRACT

According to one embodiment, an arithmetic device includes one or a plurality of arithmetic units. One of the one or plurality of arithmetic units includes a memory part including a plurality of memory regions, and an arithmetic part. At least one of the memory regions includes a memory element. The memory element is of a shift register-type.

5 Claims, 5 Drawing Sheets

(56) References Cited

U.S. PATENT DOCUMENTS

| | | | |
|---|---|---|---|
| 2002/0062420 A1* | 5/2002 | Mclaughlin | H04N 21/231 |
| | | | 711/100 |
| 2006/0159468 A1 | 7/2006 | Kouchi et al. | |
| 2009/0024816 A1 | 1/2009 | Thibadeau et al. | |
| 2010/0177230 A1 | 7/2010 | Himeno et al. | |
| 2018/0173571 A1 | 6/2018 | Huang et al. | |
| 2019/0332929 A1* | 10/2019 | Schie | H01L 27/14612 |

FOREIGN PATENT DOCUMENTS

| | | |
|---|---|---|
| JP | 2006-184315 A | 7/2006 |
| JP | 2009-32259 A | 2/2009 |
| WO | WO 91/18350 A1 | 11/1991 |
| WO | WO 2008/018363 A1 | 2/2008 |
| WO | WO 2018/103736 A1 | 6/2018 |

OTHER PUBLICATIONS https://www.sel.co.jp/tecnology/os_isi.html, 4 pages, and machine translation, 2 page.

McCulloch et al., "A Logical Calculus of the Ideas Immanent in Nervous Activity," Bulletin of Mathematical Biophysics, vol. 5, pp. 115-133 (1943) (reprinted pp. 1-21).

Hopfield, "Neural networks and physical systems with emergent collective computational abilities," Proc. Natl. Acad. Sci. USA, vol. 79, pp. 2554-2558 (1982).

Merolla et al., "A million spiking-neuron integrated circuit with a scalable communication network and interface's," Science, vol. 345, Issue 6197, pp. 668-673 (2014).

* cited by examiner

| | |
|---|---|
| 10 | memory part |
| 10U | arithmetic unit |
| 10R | memory region |
| 10D | memory element |
| 20 | arithmetic part |
| 25 | arithmetic circuit |
| 26 | A/D converter |
| 110 | arithmetic device |
| $X_j$ | variable |
| $W_{ij}$ | variable group |

| | |
|---|---|
| 10D | memory element |
| 10IN | input |
| 10OUT | output |
| 40 | CCD |
| 40E | light-emitting element |
| 40L | light |
| 40R | light receiving element |
| 40S | output signal |
| 41 | semiconductor layer |
| 41s | base body |
| 41Q | charge |
| 42 | insulating layer |
| 43 | electrode |
| 45 | output circuit |

| | |
|---|---|
| 10 | memory part |
| 10D | memory element |
| 10U | arithmetic unit |
| 20 | arithmetic part |
| 60 | flip-flop element |
| 61 | flip-flop circuit |

| 10D | memory element |
| 20 | arithmetic part |
| 25 | arithmetic circuit |
| 26 | A/D converter |

| | |
|---|---|
| 10U | arithmetic unit |
| 30 | sum circuit |
| 110 | arithmetic device |

ARITHMETIC DEVICE

CROSS-REFERENCE TO RELATED APPLICATIONS

This application is based upon and claims the benefit of priority from Japanese Patent Application No. 2018-131057, filed on Jul. 10, 2018; the entire contents of which are incorporated herein by reference.

FIELD

Embodiments described herein relate generally to an arithmetic device.

BACKGROUND

A larger-scale arithmetic device is desirable.

DETAILED DESCRIPTION

Figure 1:
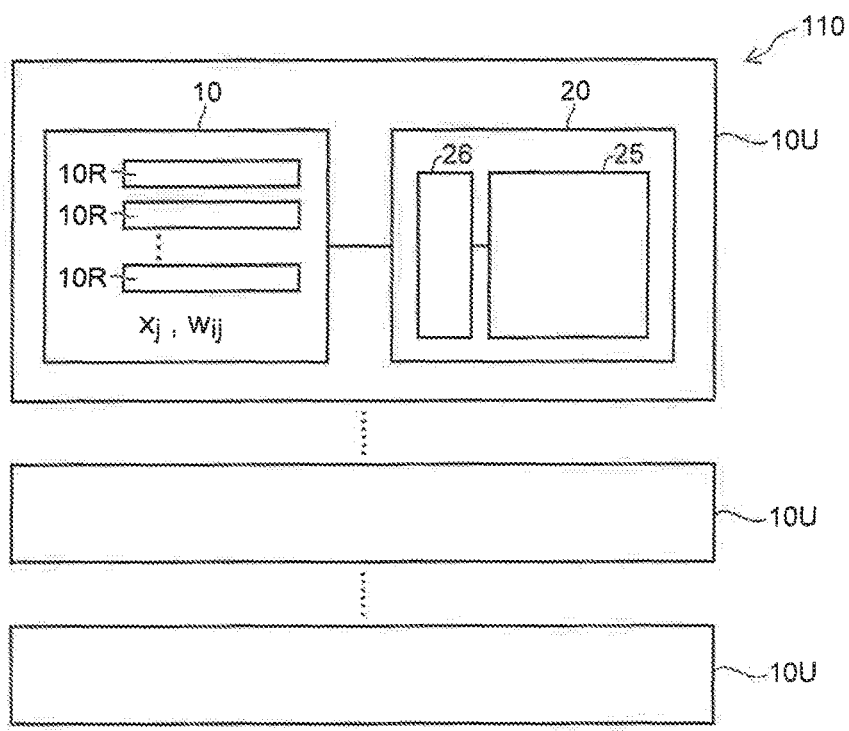
FIG. 1 is a schematic view illustrating an arithmetic device according to a first embodiment.

According to one embodiment, an arithmetic device includes one or a plurality of arithmetic units. One of the one or plurality of arithmetic units includes a memory part including a plurality of memory regions, and an arithmetic part. At least one of the memory regions includes a memory element. The memory element is of a shift register-type.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating an arithmetic device according to a first embodiment.

As shown in FIG. 1, the arithmetic device 110 according to the embodiment includes one or multiple arithmetic units 10U. One of the one or multiple arithmetic units 10U includes a memory part 10 and an arithmetic part 20. The memory part 10 includes multiple memory regions 10R.

For example, one of the multiple memory regions 10R can store (or hold) a variable $x_j$. For example, another one of the multiple memory regions 10R can store (or hold) a variable group $w_{ij}$. The variable group $w_{ij}$ may be, for example, a matrix.

For example, the arithmetic device 110 according to the embodiment can be used for calculations corresponding to a neural network. In such a case, for example, the variable $x_j$ corresponds to the states of the neurons. For example, the variable group $w_{ij}$ corresponds to the states of the synapse parameters.

The information (e.g., the variables or the like) that is stored in the memory part 10 is supplied to the arithmetic part 20. The arithmetic part 20 performs calculations based on the information. The calculations include, for example, a product-sum operation. In one example, the product-sum operation includes the calculation of $h_i = \Sigma w_{ij} x_j$.

For example, the arithmetic part 20 includes an arithmetic circuit 25. Calculations are performed in the arithmetic circuit 25. The arithmetic part 20 may include an A/D converter 26. For example, the information may be converted into binary when the information stored in the memory part 10 is ternary or higher-base (or analog, etc.). The converted information is supplied to the arithmetic circuit 25. The arithmetic circuit 25 performs the calculations based on the converted information.

The arithmetic unit 10U functions as one "core."

Figure 2:
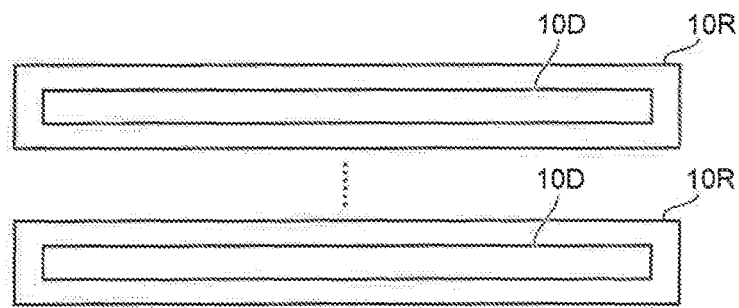
FIG. 2 is a schematic view illustrating the arithmetic device according to the first embodiment.

FIG. 2 is a schematic view illustrating the arithmetic device according to the first embodiment.

As shown in FIG. 2, at least one of the multiple memory regions 10R includes a shift register-type memory element 10D.

In the embodiment, the size of the memory part 10 can be reduced drastically by using the shift register-type memory element 10D. For example, an extremely large amount of information can be stored in a small surface area. An arithmetic device can be provided in which a larger scale is possible.

Generally, SRAM is used as the memory part. In SRAM, a peripheral circuit that requires a large surface area is provided in addition to the memory element part. An address decoder, a read circuit and a write circuit for the individual elements, etc., are included in the peripheral circuit. In SRAM, the proportion occupied by the peripheral circuit is large compared to the memory element part. Therefore, it is difficult to increase the memory capacity of the memory part.

Conversely, the embodiment includes the shift register-type memory element 10D; and the peripheral circuit is simple. Therefore, the surface area of the peripheral circuit can be small; and the size of the memory part 10 can be reduced drastically.

Thus, in the embodiment, the shift register-type memory element 10D is used in the memory part 10 of the core (the arithmetic unit 10U). The surface area of the peripheral circuit and the interconnects of the memory element 10D can be reduced. Therefore, the memory capacity of the memory part 10 can be increased. Thereby, a large-scale neuromorphic computer is possible.

Higher performance and higher functionality are desirable for computers and electronic devices. It is desirable for the arithmetic device to be able to accommodate an enormous amount of information processing. By increasing the scale of the information processing, for example, the enormous amount of information processing of the IoT (Internet of Things), AI (Artificial Intelligence), deep learning, etc., can be accommodated.

On the other hand, the development of energy-conserving electronics also is desirable. By higher energy conservation, for example, $CO_2$ reduction which is discussed on a global scale can be accommodated. By higher energy conservation, for example, the electrical power circumstances after a large-scale disaster can be relaxed.

For such conditions, neural networks are drawing attention as energy-conserving electronics that learn from living bodies. The relationship between neural networks and electronics has an old history. For example, the neuron model of McCulloch and Pitts presented in 1943 is known (W. S. McCulloch and W. Pitts: Bull. Math. Biophys. 5, 115 (1943)).

Subsequently, Hopfield had a major breakthrough in the field of neural networks in 1982 (J. J. Hopfield: Proc. Natl. Acad. Sci. U.S.A. 79, 2554 (1982)). He showed that an interconnected network can be represented by the Hamiltonian of an Ising spin model. Thereby, it is possible to examine information processing in a neural network by using the statistical mechanics of a spin system. Further, it became possible to associate Ising spins, which can have the binary states of up or down spins, with the activity of a neuron or an information bit.

As new hardware for a neural network, an element called the True North chip was developed jointly by IBM and Cornell University in 2014 (P. A. Merolla et al., Science 345, 668 (2014)). In this example, the element was constructed using 28-nm rule CMOS technology. As an entirety, the element operated as one million neurons. Compared to the brain of a human which is configured from 14 billion neurons, the scale of the element was small.

Neural network hardware that is typified by the True North chip also is called a neuromorphic computer. This is a massively parallel distributed computer. The massively parallel distributed computer includes many arithmetic units called cores. An arithmetic part and a memory part are provided in one of the arithmetic units. A product-sum operation and the like are performed in the arithmetic part. For example, the states of the neurons, the synapse parameters, etc., are stored in the memory part.

SRAM is used in the memory part of a conventional massively parallel distributed computer. As recited above, a large peripheral circuit of the address decoder, the read and write circuits, etc., is necessary in SRAM.

There are expectations for neuromorphic computers to be used as large-scale energy-conserving information processors comparable to the human brain; but currently, scale increases are exceedingly insufficient. One cause is that it is difficult to obtain a memory part having a sufficient memory capacity.

In the embodiment, the memory capacity of the memory part 10 can be increased. A large-scale neuromorphic computer is possible. The arithmetic device 110 according to the embodiment is trainable.

One example of the shift register-type memory element 10D will now be described.

Figure 3A:
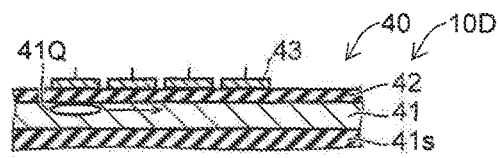
FIG. 3A to FIG. 3C are schematic views illustrating a part of the arithmetic device according to the first embodiment.
Figure 3B:
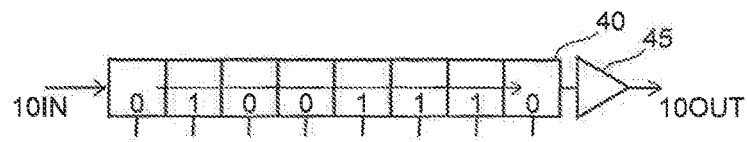
Figure 3C:
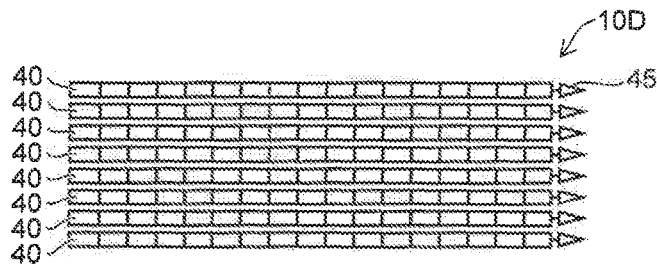

FIG. 3A to FIG. 3C are schematic views illustrating a part of the arithmetic device according to the first embodiment.

These drawings show an example of the shift register-type memory element 10D. The memory element 10D includes a charge-coupled device 40 (CCD).

FIG. 3A is a schematic cross-sectional view. As shown in FIG. 3A, the charge-coupled device 40 includes a semiconductor layer 41, an insulating layer 42, and multiple electrodes 43. The insulating layer 42 is provided between the semiconductor layer 41 and the multiple electrodes 43. In the example, the semiconductor layer 41 is provided on a base body 41s. The insulating layer 42 and the multiple electrodes 43 are provided in this order on the semiconductor layer 41.

A charge 41Q of the semiconductor layer 41 is shifted by applying voltage pulses in order to the multiple electrodes 43. The state of the charge 41Q corresponds to the information stored in the charge-coupled device 40.

As shown in FIG. 3B, the charge 41Q is injected as an input 101N into one end (the left end) of the charge-coupled device 40. By applying voltage pulses in order to the multiple electrodes 43, the charge 41Q is sequentially shifted toward the other end (in the example, the right end). The parts that correspond to the multiple electrodes 43 each function as one register. An output circuit 45 may be provided at the other end (in the example, the right end). A signal that corresponds to the state of the charge 41Q is output as an output 10OUT from the output circuit 45.

As shown in FIG. 3C, the shift register-type memory element 10D may include, for example, the multiple charge-coupled devices 40. When writing or reading the signal (the information) to and from the shift register-type memory element 10D, it is unnecessary to access each of the multiple registers. The signals can be written sequentially to the one end and read sequentially from the other end. Therefore, the peripheral circuit of the memory element 10D is simple. The surface area of the memory element 10D can be reduced. Thereby, a large capacity can be stored in a small surface area. An arithmetic device can be provided in which a larger scale is possible.

In one example, the charge-coupled device 40 can store a binary state. In such a case, the charge-coupled device 40 functions as a digital memory element.

In another example, the charge-coupled device 40 may be configured to store a ternary or higher-base state. For example, the charge-coupled device 40 may be configured to store analog information. In such a case, the charge-coupled device 40 functions as a multi-bit memory element.

For example, the amount of the charge 41Q may be treated as an analog quantity having 0 to 16 gradations. In such a case, for example, one memory cell corresponds to a four-bit digital cell. Thereby, the surface area of the memory element 10D can be reduced drastically. The memory capacity can be increased effectively.

For example, the charge-coupled device 40 may include an oxide semiconductor. For example, the semiconductor layer 41 may include an oxide semiconductor. The oxide semiconductor includes, for example, oxygen and a first element including at least one of In, Ga, Zn, Al, Sn, Ti, Si, or Ge. By using the oxide semiconductor, for example, good gradation is obtained easily.

Figure 4:
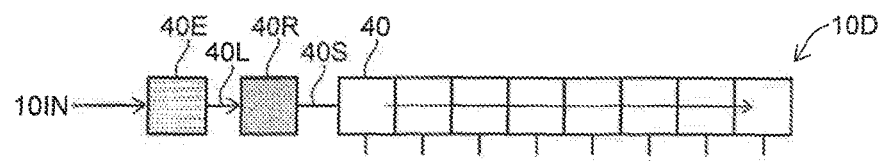
FIG. 4 is a schematic view illustrating a part of the arithmetic device according to the first embodiment.

FIG. 4 is a schematic view illustrating a part of the arithmetic device according to the first embodiment.

As shown in FIG. 4, the shift register-type memory element 10D may further include a light-emitting element 40E and a light receiving element 40R in addition to the charge-coupled device 40.

A signal that corresponds to the input 10IN is supplied to the light-emitting element 40E. Light 40L is emitted from the light-emitting element 40E. The light 40L that is emitted from the light-emitting element 40E enters the light receiving element 40R. An output signal 40S of the light receiving element 40R is supplied to the charge-coupled device 40. The charge 41Q based on the output signal 40S is injected into the charge-coupled device 40.

By providing the light-emitting element 40E and the light receiving element 40R, the inputter (the input 10IN) and the charge-coupled device 40 are electrically unconnected. For example, the degrees of freedom of the interconnects increase. As a result, the memory capacity can be increased.

Second Embodiment

In a second embodiment, the shift register-type memory element 10D includes a digital shift register.

Figure 5A:
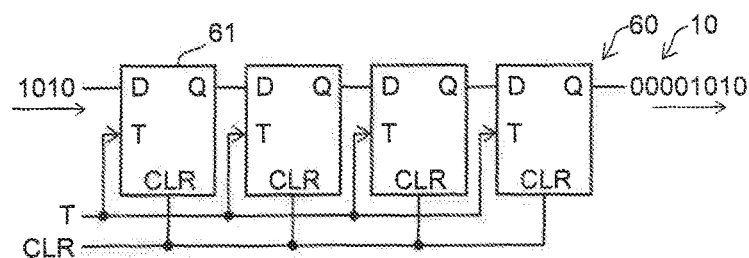
FIG. 5A and FIG. 5B are schematic views illustrating a part of an arithmetic device according to a second embodiment.
Figure 5B:
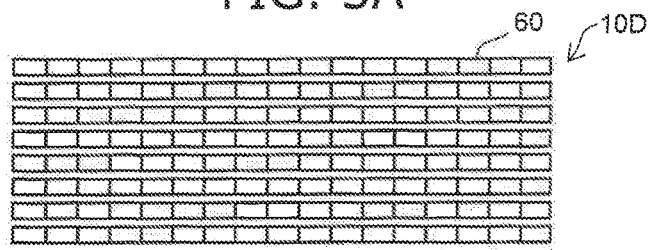

FIG. 5A and FIG. 5B are schematic views illustrating a part of an arithmetic device according to the second embodiment.

These drawings illustrate the shift register-type memory element 10D of the memory part 10 of the arithmetic device 120 according to the embodiment. Otherwise, the configuration of the arithmetic device 120 is similar to, for example, the arithmetic device 110. An example of the shift register-type memory element 10D of the arithmetic device 120 will now be described.

In the example as shown in FIG. 5A, the shift register-type memory element 10D includes a flip-flop element 60. In such a case, the memory element 10D functions as a digital shift register.

The flip-flop element 60 includes, for example, multiple flip-flop circuits 61. The multiple flip-flop circuits 61 are electrically connected in one column. One piece of information (in the example, "1010") is input to one end (e.g., the left end) of the flip-flop element 60. For example, each time a pulse signal is input to a "T terminal," the information is shifted from the one end (e.g., the left end) toward the other end (e.g., the right end).

As shown in FIG. 5B, for example, multiple flip-flop elements 60 may be provided in the shift register-type memory element 10D.

The surface area of one bit is large in a digital shift register. However, digital shift registers have a high level of technical perfection. A larger scale is obtained easily by providing multiple digital shift registers as the shift register-type memory element 10D.

An example of an application of the arithmetic device (e.g., the arithmetic device 110 or 120, etc.) according to the embodiments will now be described. In the following example, the arithmetic device performs calculations corresponding to a neural network.

Figure 6:
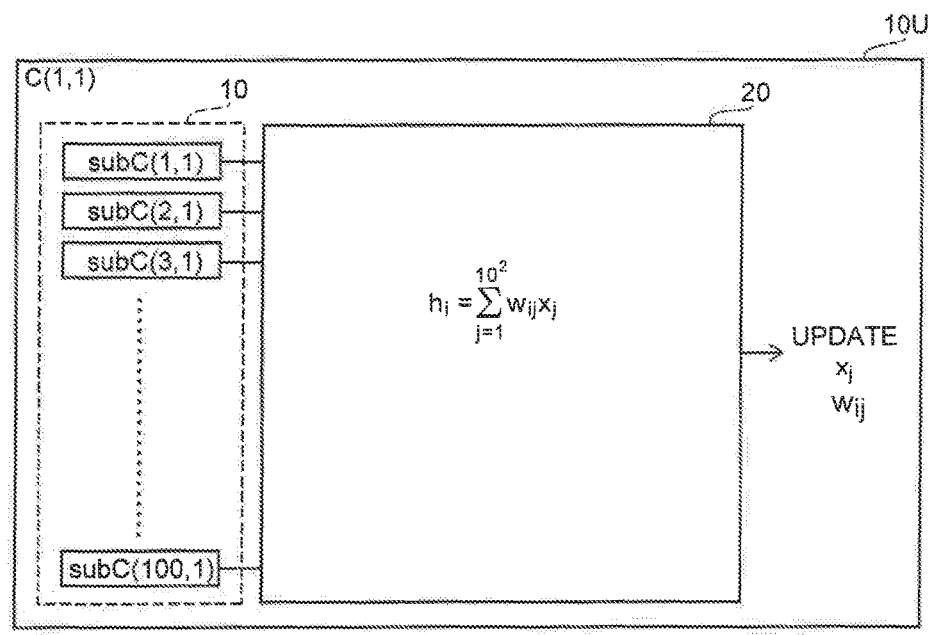
FIG. 6 is a schematic view illustrating the arithmetic device according to the embodiment.

FIG. 6 is a schematic view illustrating the arithmetic device according to the embodiment.

As shown in FIG. 6, for example, one arithmetic unit 10U corresponds to a core C(1, 1). The core C(1, 1) is, for example, at least a part of an Ising machine. In the example, "i" is 1; and "j" is an integer of 1 to 100.

In the core C(1, 1), the memory part 10 includes multiple sub-cores (sub-cores subC(1, 1) to subC(100, 1)). In the example, the number of multiple sub-cores is 100. The number of multiple sub-cores is arbitrary in the embodiment.

The information (e.g., the variable $x_j$, the variable group $w_{ij}$, etc.) that is stored in the memory part 10 is supplied to the arithmetic part 20. A product-sum operation of the variable $x_j$ and the variable group $w_{ij}$ is performed in the arithmetic part 20. For example, a determination based on the calculation result is performed in the arithmetic part 20. After the determination, for example, the variable $x_j$ is updated (UPDATE $x_j$). After the determination, for example, at least one of the variable $x_j$ or the variable group $w_{ij}$ may be updated.

Figure 7:
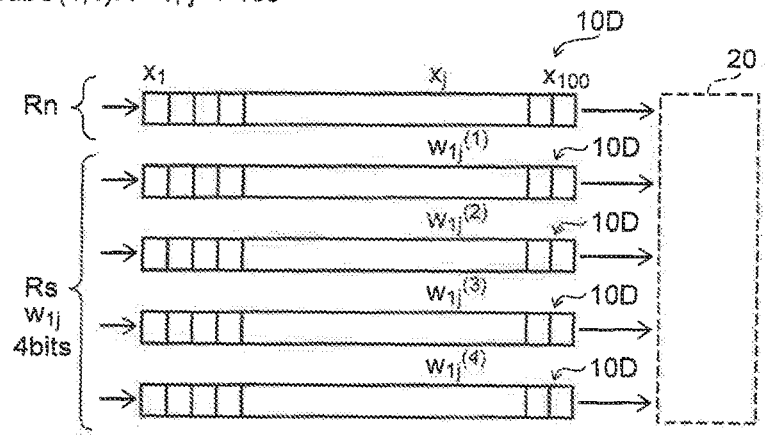
FIG. 7 is a schematic view illustrating a part of the arithmetic device according to the embodiment.

FIG. 7 is a schematic view illustrating a part of the arithmetic device according to the embodiment.

FIG. 7 shows an example of one sub-core (in the example, subC(1, 1)). For example, multiple shift register-type memory elements 10D are provided.

One of the multiple memory elements 10D is used as a neuron register Rn. Information relating to the variable $x_j$ (e.g., the variables $x_1$ to $x_{100}$) is stored in the memory element 10D used as the neuron register Rn.

Some of the multiple memory elements 10D are used as synapse registers Rs. In the example, the variable group $w_{ij}$ is treated as four bits of information. Information relating to the variable group $w_{ij}$ (in the example, $w_{1j}^{(1)}$, $w_{1j}^{(2)}$, $w_{1j}^{(3)}$, and $w_{ij}^{(4)}$) is stored in the multiple memory elements 10D used as the synapse registers Rs.

The Information (the variable $x_j$ and the variable group $w_{ij}$) is written to the multiple memory elements 10D. The information that is written to the multiple memory elements 10D is read and supplied to the arithmetic part 20. For example, a product-sum operation is performed by the arithmetic part 20. At least one of the neuron states (e.g., the variable $x_j$) or the synapse parameter states (e.g., the variable group $w_{ij}$) are updated based on the calculation result.

In the example, the sub-core corresponds to a digital shift register. The variable $x_j$ is treated as one bit; and the variable group $w_{ij}$ is treated as four bits. In the embodiment, the format of the information relating to the variable $x_j$ and the variable group $w_{ij}$ is arbitrary.

Figure 8:
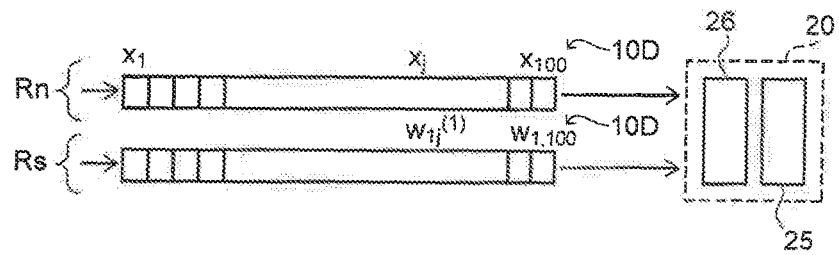
FIG. 8 is a schematic view illustrating a part of the arithmetic device according to the embodiment.

FIG. 8 is a schematic view illustrating a part of the arithmetic device according to the embodiment.

FIG. 8 also shows an example of one sub-core (in the example, the sub-core subC(1, 1)). The multiple shift register-type memory elements 10D are provided.

In the example as well, one of the multiple memory elements 10D is used as the neuron register Rn. Information relating to the variable $x_j$ (e.g., the variables $x_1$ to $x_{100}$) is stored in the neuron register Rn.

On the other hand, one of the multiple memory elements 10D is used as the synapse register Rs. One of the multiple memory elements 10D is, for example, the charge-coupled device 40. Ternary or higher-base information (e.g., analog information) is stored in the charge-coupled device 40. In such a case, the variable $x_j$ and the variable group $w_{ij}$ can be stored respectively in one-bit elements.

The Information (the variable $x_j$ and the variable group $w_{ij}$) that is written to the multiple memory elements 10D is supplied to the arithmetic part 20. For example, the arithmetic part 20 may include the A/D converter 26. The information that is converted by the A/D converter 26 is supplied to the arithmetic circuit 25. For example, a product-sum operation is performed by the arithmetic circuit 25. At least one of the neuron states (e.g., the variable $x_j$) or the synapse parameter states (e.g., the variable group $w_{ij}$) are updated based on the calculation result.

Other sub-cores also may have configurations similar to that of the sub-core subC(1, 1) recited above.

Figure 9:
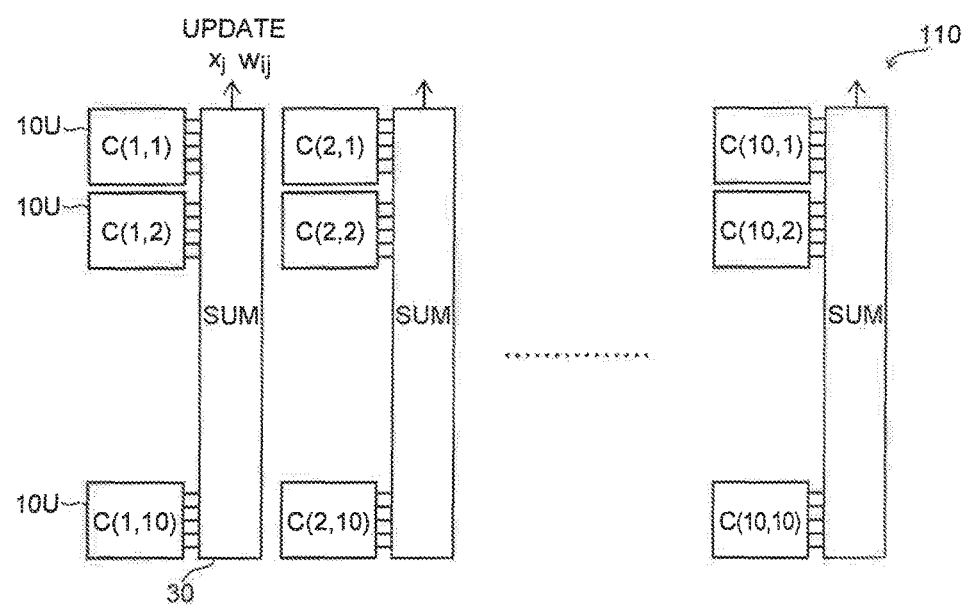
FIG. 9 is a schematic view illustrating the arithmetic device according to the embodiment.

FIG. 9 is a schematic view illustrating the arithmetic device according to the embodiment.

As shown in FIG. 9, the arithmetic device 110 or 120 may include the multiple arithmetic units 10U. The multiple arithmetic units 10U correspond to multiple cores. In the example, the cores C(1, 1) to C(10, 10) are provided. The number of multiple cores is 100.

For example, ten cores (core(1, 1) to core(1, 10)) are used as one group. The calculation result of one group is supplied to a sum circuit 30. The sum of the calculation result of one group is calculated in the sum circuit 30. For example, at least one of the variable $x_j$ or the variable group $w_{ij}$ is updated based on the calculation result. Similar calculations are performed for the other groups as well.

In the embodiment, the memory parts 10 that are included in the multiple arithmetic units 10U (e.g., the cores) Include the shift register-type memory element 10D. The memory element 10D includes, for example, the charge-coupled device 40, etc. Thereby, the memory capacity can be large.

At least two of the multiple arithmetic units 10U may operate in parallel. Thereby, for example, a parallel distributed large-scale arithmetic device having excellent energy conservation can be provided.

According to the embodiments, an arithmetic device can be provided in which a larger scale is possible.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in arithmetic devices such as arithmetic units, memory parts, memory regions, charge-coupled devices, flip-flop elements, arithmetic parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all arithmetic devices practicable by an appropriate design modification by one skilled in the art based on the arithmetic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An arithmetic device, comprising one or a plurality of arithmetic units, one of the one or plurality of arithmetic units including:
   a memory part including a plurality of memory regions; and
   an arithmetic part,
   wherein:
      each of the memory regions includes a memory element, the memory element being of a shift register-type and including a charge-coupled device;
      each of the memory elements includes:
         a light-emitting element; and
         a light-receiving element,
      light emitted from the light-emitting elements enters the corresponding light-receiving elements; and
      an output signal of each of the light-receiving elements is supplied to the charge-coupled device corresponding to each of the memory regions.

2. The device according to claim 1, wherein the charge-coupled device can store a ternary or higher-base state.

3. The device according to claim 1, wherein the charge-coupled device can store a binary state.

4. The device according to claim 1, wherein the charge-coupled device includes an oxide semiconductor.

5. The device according to claim 1, wherein at least two of the arithmetic units operate in parallel.

* * * * *